United States Patent [19]
Heim et al.

[11] Patent Number: 6,068,175
[45] Date of Patent: May 30, 2000

[54] SYSTEM FOR REPLACING A FIRST AREA ARRAY COMPONENT CONNECTED TO AN INTERCONNECT BOARD

[75] Inventors: Craig G. Heim, Kirkwood, N.Y.;
Russell H. Lewis, Fort Collins, Colo.;
Mark V. Pierson, Binghamton, N.Y.;
Karl J. Puttlitz, Wappingers Falls, N.Y.

[73] Assignee: International Business Machines Corporation, Armonk, N.Y.

[21] Appl. No.: 09/162,739

[22] Filed: Sep. 29, 1998

Related U.S. Application Data

[62] Division of application No. 08/514,703, Aug. 14, 1995, Pat. No. 5,862,588.

[51] Int. Cl.[7] .......................... B23K 37/02; B23K 1/00; B23K 5/00; B23K 31/00; B23K 31/02
[52] U.S. Cl. .......................... 228/45; 228/6.2; 228/44.7; 228/180.21; 228/218; 228/221; 29/840
[58] Field of Search .......................... 228/45, 180, 221, 228/20, 180.2, 44.7, 180.21, 180.22, 6.2, 20.1, 212, 218; 29/840, 402.08, 743, 760; 269/903

[56] References Cited

U.S. PATENT DOCUMENTS

| | | | |
|---|---|---|---|
| 4,415,116 | 11/1983 | Norton | 228/180 A |
| 4,552,300 | 11/1985 | Zovko et al. | 228/20 |
| 5,148,968 | 9/1992 | Schmidt et al. | 228/180.2 |
| 5,178,315 | 1/1993 | Konno et al. | 228/44.7 |
| 5,197,652 | 3/1993 | Yamazaki | 228/44.7 |
| 5,207,372 | 5/1993 | Funari et al. | 228/180.2 |
| 5,240,170 | 8/1993 | Nishida et al. | 228/180.21 |
| 5,317,803 | 6/1994 | Spigarelli et al. | 29/840 |
| 5,351,876 | 10/1994 | Belcher et al. | 228/180.22 |
| 5,435,732 | 7/1995 | Angulas et al. | 439/67 |
| 5,615,477 | 4/1997 | Sweitzer | 29/840 |

FOREIGN PATENT DOCUMENTS

| | | |
|---|---|---|
| 004243385 A1 | 6/1994 | Germany . |
| 402202094 | 8/1990 | Japan . |
| 403171695 | 7/1991 | Japan . |
| 404186696 | 7/1992 | Japan . |
| 405283857 | 10/1993 | Japan . |
| WO/92010078 | 6/1992 | WIPO . |

*Primary Examiner*—Patrick Ryan
*Assistant Examiner*—Zidia J. Pittman
*Attorney, Agent, or Firm*—Ratner & Prestia; John R. Pivnichny

[57] ABSTRACT

Apparatus for connecting a first area array component to a substrate with a joining material. The apparatus has a nozzle directing heat toward both the first area array component and the portion of the substrate beneath the first area array component to melt the joining material. An elastic seal contacts the substrate and prevents the heat from affecting other components adjacent the first area array component. The nozzle is pressed against the substrate to restrain warping of the substrate, which might be caused by the heating of the first area array component, and to prevent damage to the substrate. The nozzle can tilt so that it conforms to the surface of the substrate. The first area array component is allowed to move freely in the direction of a plane of the substrate under the surface tension of the molten joining material during heating to center the first area array component.

20 Claims, 4 Drawing Sheets

SYSTEM FOR REPLACING A FIRST AREA ARRAY COMPONENT CONNECTED TO AN INTERCONNECT BOARD

This application is a division of application Ser. No. 08/514,703, filed Aug. 14, 1995, now U.S. Pat. No. 5,862,588.

FIELD OF INVENTION

The present invention relates to soldered connection between bumps of area array components, and contacts on circuitized rigid organic substrates. More particularly the invention is related to replacing such components including removing area array components, redressing area array component sites, placing replacement components on the sites, and reflowing to solder the bumps of the replacement area array components to the contacts.

The following background is provided to assist those skilled in the art to utilize the invention of the Application and is not an admission regarding priority or statement that a search has been conducted.

BACKGROUND

U.S. Pat. Nos. 3,401,126 and 3,429,040 to Miller suggest connecting integrated computer (IC) chips by a grid array of C4 joints to ceramic substrates.

Fabrication of rigid organic circuit boards are suggested in U.S. Pat. Nos. 3,554,877; 3,791,858; and 3,554,877.

U.S. Pat. No. 5,024,372 to Altman suggests forming solder pads by using a squeegee to force paste onto contact pads at holes in a thick layer of solder resist; and U.S. Pat. No. 5,211,764 to Degani suggests printing solder through a stencil for connecting flip chips. "Ball Grid Arrays: the Hot New Package" by Terry Costlow and "Solder Balls Make Connections" by Glenda Derman both in *Electronic Engineering Times*, Mar. 15, 1993, suggest using solder balls to connect ceramic and flexible chip carriers to circuit boards.

U.S. Pat. No. 5,207,372 to Funari et al suggests a head for heating a semiconductor chip and applying force against the top surface of the semiconductor chip to form solder joints between 97/3 Pb/Sn solder bumps on the bottom surface of the chip and contacts on top of an epoxy resin circuit board reinforced by fiberglass. A backing plate is shown on the opposite side of the board from the connection.

U.S. Pat. No. 5,178,315 to Konno et al suggests a pusher for pushing a push head against a component (IC chip) on a substrate and a supporting device with a support head and spring 42 for supporting the substrate on the opposite side of the substrate from the component. During soldering using light beams, "the push head and support head restrain the substrate from thermal deformation."

U.S. Pat. No. 5,317,803 to Spigarelli et al suggests a device for pressing the peripheral leads of an IC device against a printed circuit board during soldering.

U.S. Pat. No. 4,552,300 to Zovko et al suggests a soldering-desoldering device including a ceramic housing with an open end which rests on the surface of a printed wiring board enclosing a leadless chip carrier and a ceramic heater assembly with an internal passageway. The housing interior conforms to the carrier and the heater conforms to the interior of the housing and slides within the housing. The heater assembly is lowered close to the carrier, pressurized air is introduced between the heater and housing, heated, and directed to the joints at the periphery of the carrier module. A vacuum is applied to the passageway to remove the air to prevent leaking between the housing and board.

The entire disclosures of the above citations are incorporated herein by reference for convenience.

OBJECTS OF THE INVENTION

It is an object of the invention to provide a simple mechanism and method for replacing area array components surface mounted to a rigid organic substrate.

It is an object of the invention to apply enough heat to such components to reflow solder paste to attach such components.

It is an object of the invention to apply enough heat to such components to soften solder joints to easily remove such components.

It is another object to apply such heat to such component while minimizing the heating of the substrate to prevent damaging the substrate or warping the substrate.

It is another object of the invention to hold the substrate flat while heating a component to be replaced and while reflowing solder for attaching a replacement area array component.

It is another object of the invention to prevent mechanical damage to the substrate surface by the holding apparatus during replacement of such area array components.

It is another object of the invention to prevent excessive heating of adjacent components which could damage the adjacent components or damage connection joints between the adjacent components and contacts of the substrate.

In the following description of the invention the term "area array component" is used for components such as ball grid array modules and flip chips in which multiple bumps along the periphery of an attachment surface of the component define a peripheral boundary of bumps and other bumps are spaced significantly inwardly from the boundary.

Also, the word "bumps" is used to refer to terminals of round cross section extending from the attachment surface including C4 bumps, eutectic bumps, eutectic coated C4 bumps, solder coated topper balls, and spherical preforms of high temperature solder.

Also, the term "rigid organic substrate" refers to substrates of organic materials that also include rigid fillers such as reinforcing fibers such as fiberglass which result in a substrate much more rigid than similar unfilled substrates.

SUMMARY OF THE INVENTION

It was discovered by the applicants that locally heating a ceramic ball grid array chip carrier sufficient to reflow eutectic Pb/Sn solder to attach the component caused local warping of a FR-10 circuit board at the carrier due to temperature gradients through the board and the warping prevents reliable soldered connection of the inner balls to connection pads on the board. The most likely defect would be a surface to surface connection which could later vary in resistance or even separate to form an open circuit. This local warping had not been a significant problem in replacing peripheral leaded components such as quad flat packs. The maximum separation between contacts and bumps for area array components is significantly greater than the maximum separation between leads and contacts for other surface mount components of similar size.

The bumps of area array components are much less flexible in the direction perpendicular to the circuit board than peripheral leads such as gull wing leads or J-leads. Because of the greater stiffness and restraint of greater thermal displacement, the force between the contacts and bumps of an area array component during cooling and any subsequent reheating for replacement, is much higher than between the contacts and leads of such peripherally leaded surface mount components.

Thus during cooling after attachment and any subsequent heating for removal, the contacts on the circuit board could potentially be pulled off from the circuit board due to the high forces caused by restraint of the local warping of the board. During cooling components could be damaged by the high forces on joints. Also, good components that need removal for flawed joints or for design changes, could potentially be damaged by the warping during removal because of high forces on individual joints during heating.

In the invention of the applicants, an area array component selected for replacement is heated to remove the component and then a replacement area array component is heated to reflow attach the replacement component.

In the invention, during heating and subsequent cooling, local warping is restrained to prevent damaging the board or components. Preferably, the holding means does not restrain the component so that the component is free to move into better alignment due to surface tension of the solder during the heating of the component and board.

In the invention in order to prevent damage to joints of adjacent components, the open end of a nozzle duct seals against the surface of a substrate without damaging the surface. Preferably the nozzle gimbals so that the angle of the end of the duct matches the angle of the surface of the substrate to closely fit the surface. Preferably the end of the nozzle is covered by an elastic material to deform over small irregularities and waves in order to closely fit the surface.

Other objects and features of these inventions will become understood from the following figures and following detailed description.

DETAILED DESCRIPTION OF THE INVENTION

Figure 1:
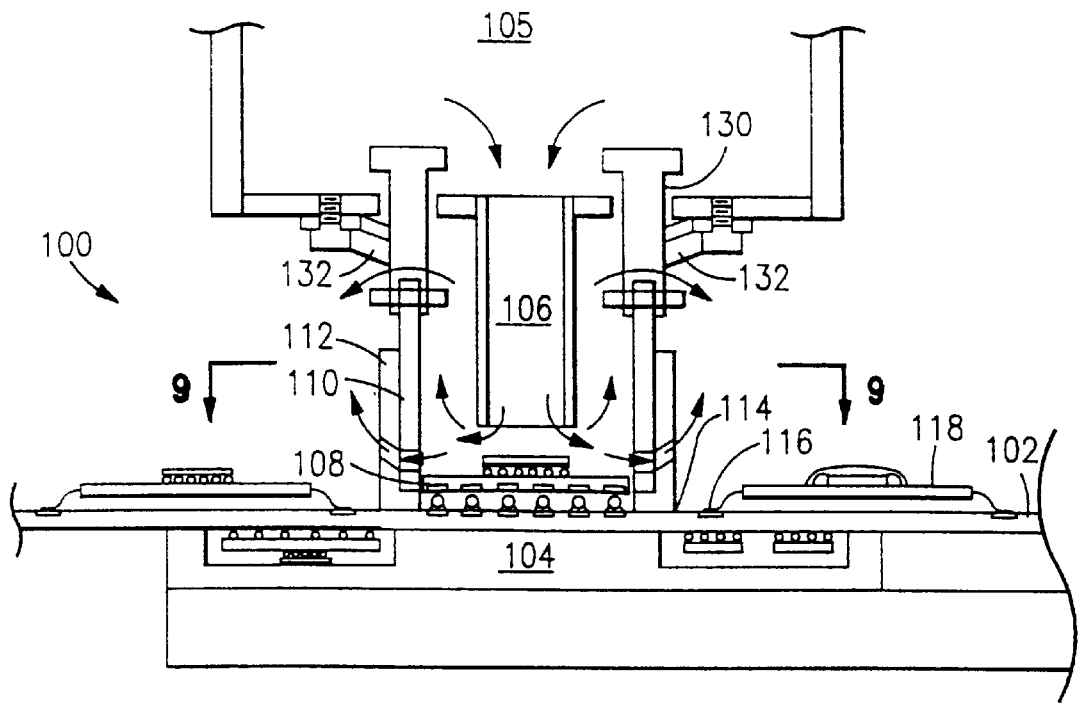
FIG. 1 shows a partial section of the hot gas nozzle of the invention over an area array module, during production of the circuit boards of the invention.

In FIG. 1 the nozzle of the invention 100 is pressed perpendicularly against substrate 102. Backing plate 104 is fixed in the direction perpendicular to the substrate. Hot gas such as air or nitrogen is directed from source 105 through an interior duct 106 against an area array component 108 such as a flip chip or ball grid array module as shown. An enclosure around the duct conforms to the peripheral shape of the component and includes metal side walls 110 and an insulating, elastic, organic, material 112 that extends under the metal walls to protect the surface of the substrate. Pressing substrate between the nozzle and backing plate restrains warping of the circuit board caused by the local heating of the board and seals the end of the enclosure against the substrate over any irregularities to prevent hot gas from jetting under side walls 110 at 114 and melting joints 116 of adjacent component 118.

Cylindrical slides 130 connected along the center of each side wall (best seen in FIG. 10) allow the enclosure to gimbal in relation to hot gas source 105 so that the angle of the end of the enclosure precisely matches the angle of the surface of the substrate at the area array component. Wavy spring 132 is a bent washer of spring metal (best seen in FIG. 10) that applies a predetermined force to the enclosure to press the enclosure against the substrate. The springs are sized to apply a force within a desired range regardless of differences in the thickness of the circuit board within expected tolerances.

Figure 2:
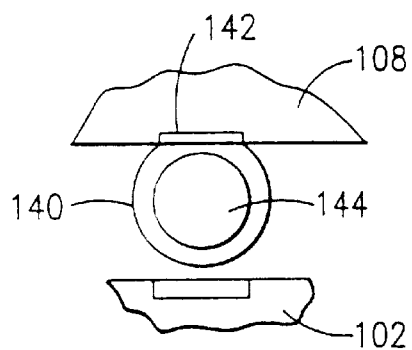
FIGS. 2–4 show various joints between the area array component and the substrate that result from the process of the invention.
Figure 3:
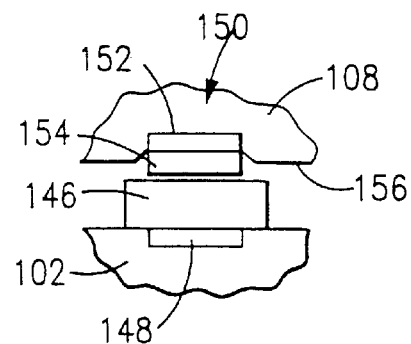
Figure 4:
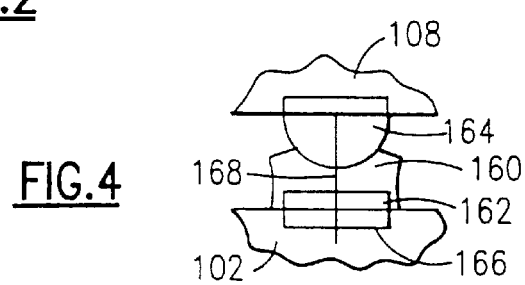

In Figs. 2–4 various configurations of joining material communicate with the bumps or contacts after placing the component on the substrate as shown in FIG. 1. In FIG. 2 the joining material 140 such as eutectic (37/63%) Pb/Sn solder has been deposited on flat copper pads 142 of the component along with a spacer ball 144 of high melting temperature solder or copper coated with solder to maintain a minimum distance between the component and substrate.

In FIG. 3 joining material 146 such as a paste of metal particles and flux which melt to form eutectic Pb/Sn solder is screened onto the substrate over contacts 148 on the substrate. Bumps 150 of the component may be only the flat copper pads 152 of the wiring layer but preferably they include a deposit 154 of material such as eutectic Pb/Sn solder to form a bump extending from attachment surface 156 of the component.

In FIG. 4 joining material 160 is screened over deposit 162 of another joining material previously used to connect another area array component that was previously removed. Preferably, the deposit results from eutectic Pb/Sn solder used to connect a bump of 90–97% Pb solder to the contact. During heating for connection and heating for removal, Pb migrates into eutectic joining solder so that deposit 162 has a Pb concentration substantially above eutectic. After reflow connection of bump 164 to contact 166, Pb concentration measurements along a radial line extending from the center of bump 164 through the contact, such as line 168, show a decreasing Pb concentration, then an increase in Pb concentration. Preformed balls of Pb and 3–15% Sn can be attached on the surfaces of respective components.

Figure 5:
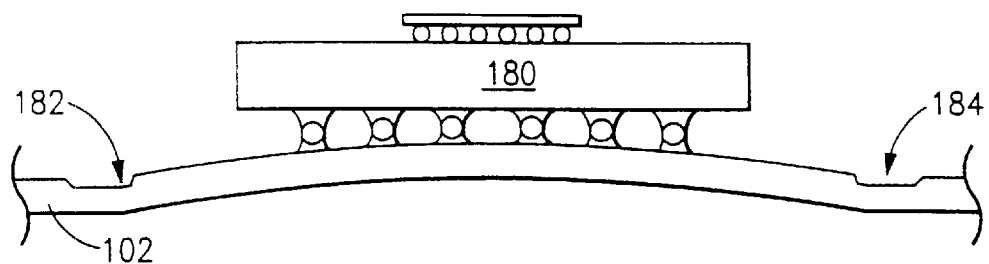
FIG. 5 shows part of the circuit board of the invention.

In FIG. 5 a relatively stiff area array component 180 such as a component with a ceramic substrate or with a thick rigid organic substrate, holds a thin rigid organic substrate 102, such as a substrate, less than 60 mils thick, of epoxy reinforced by fiberglass with attachment surfaces on at least one side of the substrate and with wiring layers on the attachment surfaces including arrays of metal contacts, in a slightly warped position after reflow connection. The pressing of the nozzle in FIG. 1 against the substrate may result in flattened regions or even depressions 182, 184 adjacent the replacement component.

Figure 6:
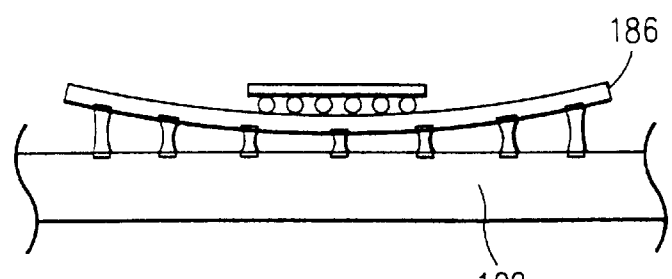
FIG. 6 shows part of another embodiment of the invention.

In FIG. 6 a relatively stiff rigid organic substrate 102 holds a more flexible area-array component 186 such as a component with a rigid organic substrate, in a warped position after reflow. The process of the invention will result in an area array component precisely centered over the contacts and with slight warping of the component and substrate that depends on the relative stiffness of the materials and relative thicknesses of the component and substrate.

Figure 7:
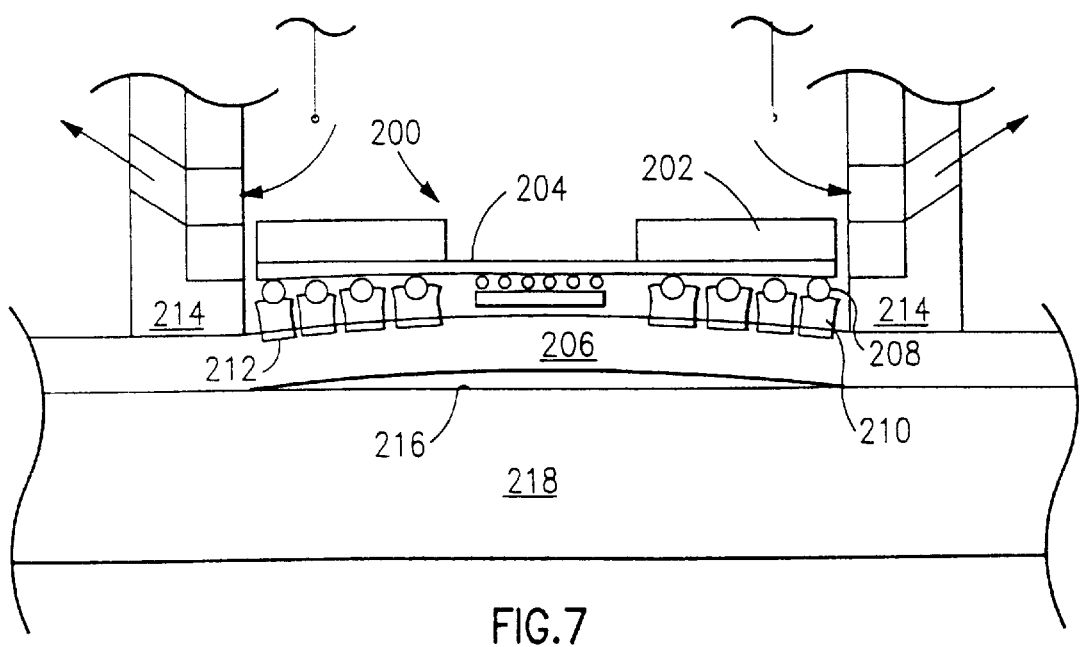
FIG. 7 shows an enlarged view of another area array component embodiment during the process of the invention.

In FIG. 7 area array component 200 with a metal frame 202 of copper (which may be nickel coated) or aluminum (preferably coated by anodizing or chromate conversion) and with a flexible substrate 204, is placed on substrate 206 with bumps 208 on eutectic solder paste 210 on contact pads 212 on an attachment surface of substrate 206. The elastic end 214 of the enclosure of the invention presses substrate 206 against backing surface 216 of backing plate 218.

Figure 8:
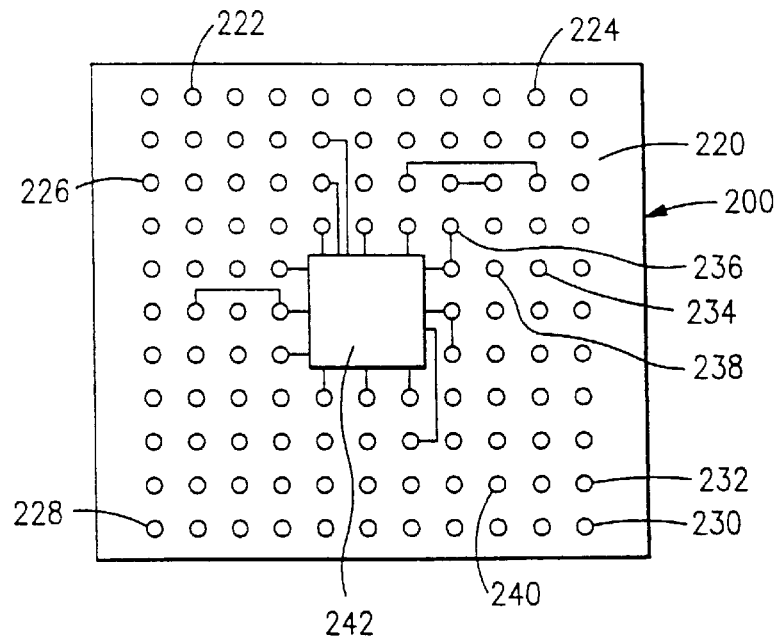
FIG. 8 illustrates the bottom view of the area array component of FIG. 7.

In FIG. 8 on the attachment surface 220 of area array component 200 of FIG. 7, rows of bumps on the attachment surface along each edge of the periphery of the surface 220 such as 222, 224, 226, 228, 230, and 232 define a boundary of the area array of bumps. Other bumps such as 234, 236, 238, and 240 are spaced inward toward a center of the array 242.

Figure 9:
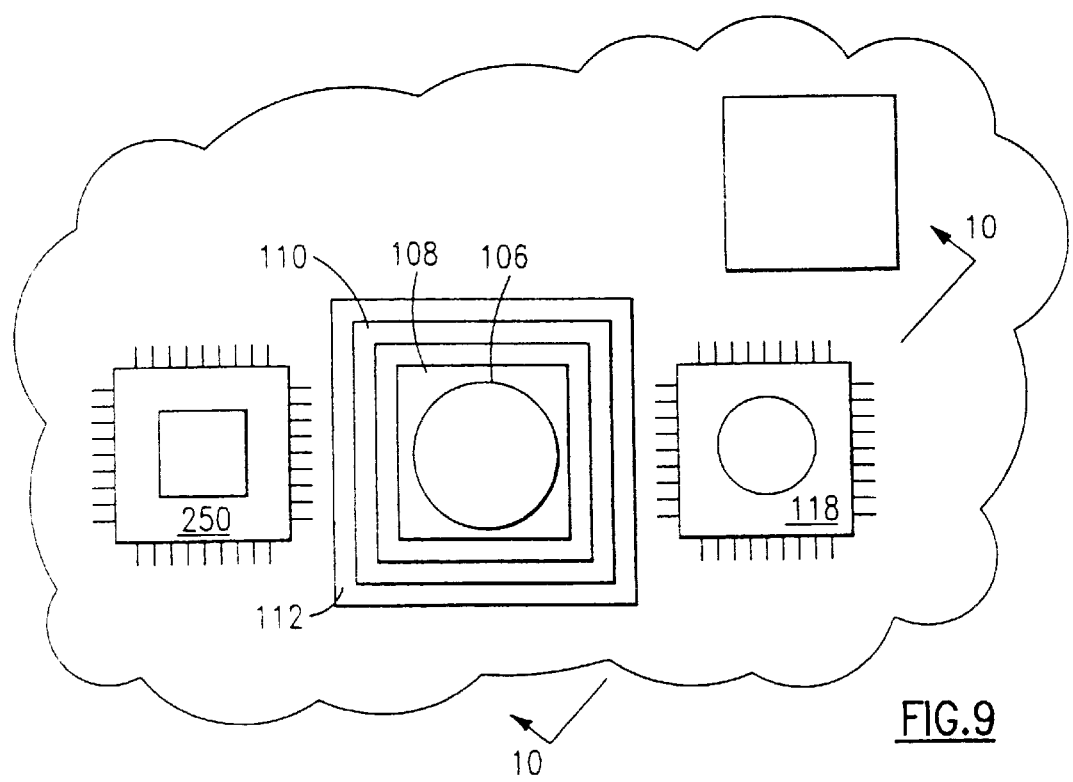
FIG. 9 shows a partial section of FIG. 1 through lines 9—9.

FIG. 9 shows a partial section of the nozzle of the invention including enclosure wall 110 conforming to the periphery of component 108, and organic coating material 112 on the exterior of the wall, and central duct 106. Also a portion of the surface of the circuit board is shown including surface mount components 118 and 250 attached to substrate. The presence of the adjacent components increases the severity of the warping in the area between the components when component 108 is heated.

Figure 10:
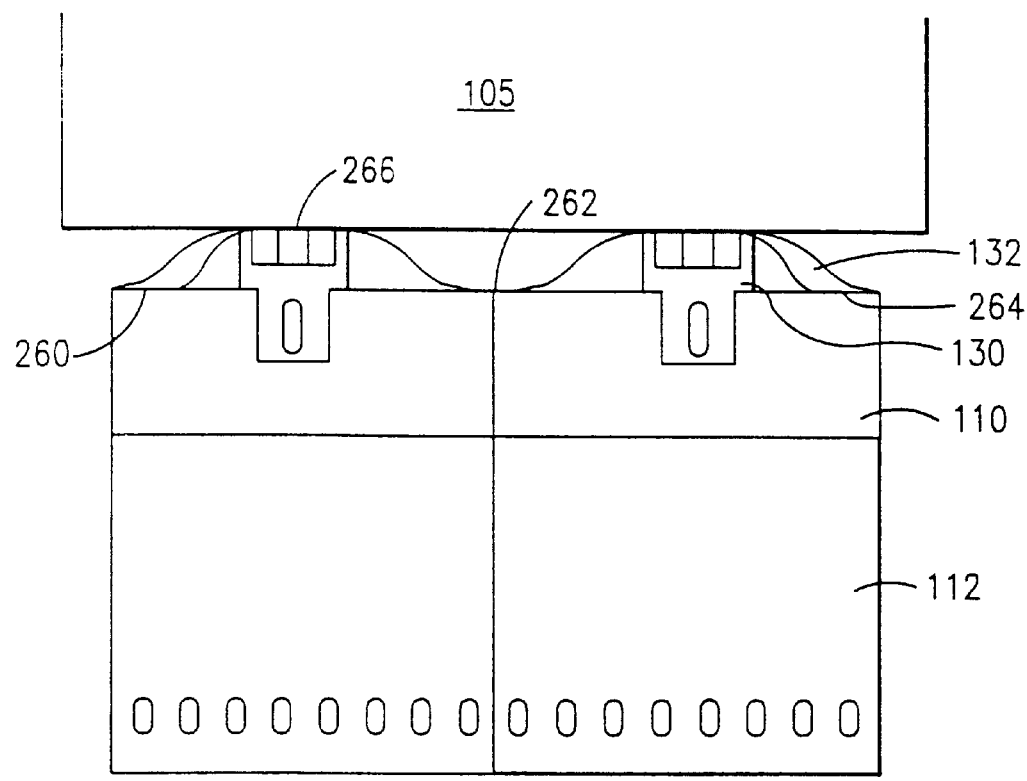
FIG. 10 illustrates a partial section of the nozzle of FIG. 9 through lines 10—10.

FIG. 10 is an elevation view of the nozzle of the invention. It shows the arrangement of the wavy spring 132 in contact with the corners of the nozzle enclosure walls shown at 260, 262, and 264 and fastened to the supply duct shown at 266 and 268.

Figure 11:
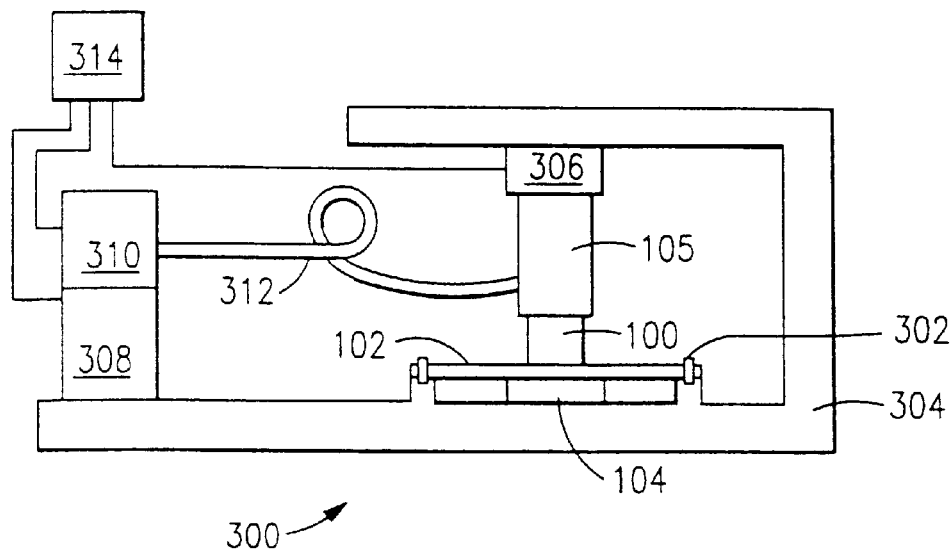
FIG. 11 shows part of the system of the invention for producing circuit boards.

FIG. 11 shows the system 300 of the invention for producing circuit boards. The system includes hot gas nozzle 100 which is moved against substrate 102 and presses the substrate against support plate 104 to restrain warping of the substrate during heating of the substrate. The circuit board is held fixed with respect to the system by pins 302 communicating with a frame 304 and the support plate is held in place by the frame. A motor 306 moves the gas source 105 to move nozzle 100. A fan 308 and electrical heater 310 provide hot gas through insulated line 312. The operation of fan 308, heater 310 and motor 306 are controlled by controller 314.

According to one aspect of the invention, a process for producing interconnect structures includes locally heating the component, the joining material, and the substrate at the contacts, sufficient to cure the joining material, to form electrically conductive joints between the bumps and the contacts, while maintaining other parts of the substrate at a significantly lower temperature and then cooling the structure.

According to another aspect of the invention, a method of producing rigid organic circuit boards includes determining if one or more of the area array components need replacing, and replacing one or more of the area array components depending on the determination. This replacement step includes the steps of: holding the board in a fixed position relative to a rework station with a rigid flattening surface confronting one side of the board; moving the open end of a duct of a nozzle relatively toward the board and against the substrate surface to enclose the component to be replaced on an opposite side of the board from the flattening surface; tilting the duct to allow the open end to conform precisely with the angle of the surface of the substrate to form a seal between the duct and substrate surface; biasing the nozzle against the substrate with a predetermined force sufficient to prevent the board when heated to bend enough to damage the substrate or component and with about the same force on opposite sides of the nozzle; producing gas sufficiently hot to soften the solder; moving the hot gas through the duct toward the open end and out holes in the nozzle to heat the solder enough to soften the solder; pulling the component to be replaced from the board; and moving the end of the duct relatively away from the board surface.

According to another aspect of the invention, a method of producing rigid organic circuit boards includes determining if one or more of the area array components need replacing and replacing one or more of the area array components depending on the determination. This replacement step includes the steps of: removing the component to be replaced from its contacts; producing replacement area array components with connectors on a respective surface; providing a solder material communicating with the contacts or connectors; placing the replacement component on the substrate with connectors aligned with respective contacts; holding the board in a fixed position relative to a rework station with a rigid flattening surface confronting one side of the substrate; moving the open end of a duct of a nozzle relatively toward the board and against the substrate surface to enclose the component on an opposite side of the board from the flattening surface; tilting the duct to allow the open end to conform precisely with the angle of the surface of the interconnect substrate to form a seal between the duct and substrate surface; biasing the nozzle against the substrate with a predetermined force sufficient to prevent the substrate when heated to bend enough to damage the substrate or component and with about the same force on opposite sides of the nozzle; producing gas sufficiently hot to reflow the solder; moving the hot gas through the duct toward the open end and out holes in the nozzle to heat the solder enough to reflow the solder material and form joints of solder metal alloy between the connectors and respective contacts; cooling the component, substrate, and solder to attach the component to the substrate; and moving the end of the duct relatively away from the board.

According to another aspect of the invention, a process for producing circuit boards includes providing substrates of epoxy reinforced by fiberglass, less than 60 mils thick, with attachment surfaces on at least one side of the substrates and with wiring layers on the attachment surfaces including arrays of metal contacts; providing chip carrier modules with surface mount terminals, the chip carrier modules including ceramic area array modules with bumps on a coupling surface; providing solder in communication with one of the contacts and the terminals; placing the ceramic area array modules on respective substrates with bumps reflow heated for attaching multiple chip carrier modules, including one or more of the ceramic area array modules mounted on each respective one of the substrates; determining whether to replace a selected one or more of the ceramic area array modules; replacing one or more of the selected ceramic area array modules selected depending upon the determination including the steps of (a) removing one or more of the selected ceramic area array modules; and (b) locally heating the respective boards proximate the selected ceramic area array module to reflow the solder.

While detailed descriptions of preferred embodiments including the best mode known by the applicants for using the invention have been shown and described, various changes and modifications may be made to these by those skilled in the art without departing from the spirit of the invention. Therefore, the scope of the invention is only limited by the following claims.

What is claimed is:

1. A system for replacing a first area array component soldered to a rigid organic circuit board having a surface, the system comprising:

means for holding the rigid organic circuit board in a fixed position;

means for providing hot gas;

a nozzle including an open nozzle end and a nozzle duct, the nozzle including a plurality of side walls extending to the open nozzle end, the open nozzle end being sufficiently large to fit over the first area array component, and the side walls defining a plurality of holes near the open nozzle end for directing the hot gas toward the open nozzle end and out of the holes;

means for moving the nozzle toward the rigid organic circuit board and away from the rigid organic circuit board;

gimbaling means connected between the moving means and the nozzle for tilting the nozzle allowing the open nozzle end to conform to the surface of the rigid organic circuit board;

force means for biasing the open nozzle end against the rigid organic circuit board with a force sufficient to restrain the rigid organic circuit board when heated from bending enough to damage one of the rigid organic circuit board and the first area array component and with about the same force on opposite sides of the nozzle; and a rigid flattening surface held fixed in relation to the plane of the rigid organic circuit board adjacent to the rigid organic circuit board to prevent the force means from bowing the rigid organic circuit board.

2. The system of claim 1 wherein:

the rigid organic circuit board defines a plurality of holes;

the holding means includes a support plate and a plurality of pins extending from the support plate into the holes in the rigid organic circuit board;

the moving means includes a motor for moving the nozzle end linearly toward and away from the rigid organic circuit board;

the gas providing means includes an electrical heater with adjustable heat and power settings;

the rigid flattening surface defines a hole for receiving at least a second area array component disposed on an opposite side of the rigid organic circuit board from the first area array component;

the moving means are automatic, and the force means includes a wave spring communicating between the moving means and the nozzle duct to apply a predetermined force through the walls of the nozzle duct to the rigid organic circuit board.

3. The system of claim 1 wherein the holding means includes a support plate.

4. The system of claim 3 wherein the rigid organic circuit board defines a plurality of holes and the holding means further includes a frame and a plurality of pins extending from the frame into the holes in the rigid organic circuit board.

5. The system of claim 1 wherein the moving means includes a motor for moving the nozzle end linearly toward and away from the rigid organic circuit board.

6. The system of claim 5 wherein the moving means is automatic.

7. The system of claim 5 wherein the moving means further includes a slide and a spring attached to the slide, the slide communicating with the nozzle duct to apply a predetermined force through the walls of the nozzle duct to the rigid organic circuit board.

8. The system of claim 1 wherein the gas providing means includes a gas source.

9. The system of claim 8 wherein the gas providing means further includes a heater.

10. The system of claim 9 wherein the gas providing means further includes a line connecting the heater with the gas source and through which the gas travels, a fan pushing the gas through the line, and a controller directing the operation of the heater and fan.

11. The system of claim 1 wherein the force means includes a wave spring communicating between the moving means and the nozzle duct to apply a predetermined force through the walls of the nozzle duct to the rigid organic circuit board.

12. The system of claim 1 wherein the rigid flattening surface defines a hole for receiving at least a second area array component disposed on an opposite side of the rigid organic circuit board from the first area array component.

13. The system of claim 1 wherein the gimbaling means includes at least one cylindrical slide connected to a side wall.

14. The system of claim 13 wherein the gimbaling means further includes at least one spring connected to a side wall.

15. The system of claim 1 further comprising an insulating elastic material extending under the side walls adjacent the open nozzle end.

16. A system for replacing a first area array component soldered to a rigid organic circuit board having a surface, the system comprising:

a support plate holding the rigid organic circuit board in a fixed position;

a gas source and a heater combining to provide hot gas;

a nozzle including an open nozzle end and a nozzle duct, the nozzle including a plurality of side walls extending to the open nozzle end, the open nozzle end being sufficiently large to fit over the first area array component, and the side walls directing the hot gas toward the open nozzle end;

a motor moving the nozzle end linearly toward and away from the rigid organic circuit board;

at least one cylindrical slide connected between the motor and the nozzle for tilting the nozzle and allowing the open nozzle end to conform to the surface of the rigid organic circuit board;

a spring biasing the open nozzle end against the rigid organic circuit board with a force sufficient to restrain the rigid organic circuit board when heated from bending enough to damage one of the rigid organic circuit board and the first area array component and with about the same force on opposite sides of the nozzle; and a rigid flattening surface held fixed in relation to the plane of the rigid organic circuit board adjacent to the rigid organic circuit board to prevent the spring from bowing the rigid organic circuit board.

17. The system of claim 16 wherein the rigid organic circuit board defines a plurality of holes and the system further comprises a frame and a plurality of pins extending from the frame into the holes in the rigid organic circuit board.

18. The system of claim 16 further comprising a line connecting the heater with the gas source and through which the gas travels, a fan pushing the gas through the line, and a controller directing the operation of the heater and fan.

19. The system of claim 16 wherein the rigid flattening surface defines a hole for receiving at least a second area array component disposed on an opposite side of the rigid organic circuit board from the first area array component.

20. The system of claim 16 further comprising an insulating elastic material extending under the side walls adjacent the open nozzle end and protecting the substrate.

* * * * *